United States Patent
Shao et al.

(10) Patent No.: US 12,376,283 B2
(45) Date of Patent: Jul. 29, 2025

(54) SEMICONDUCTOR STRUCTURE, METHOD FOR MANUFACTURING SAME

(71) Applicant: CHANGXIN MEMORY TECHNOLOGIES, INC., Hefei (CN)

(72) Inventors: Guangsu Shao, Hefei (CN); Deyuan Xiao, Hefei (CN); Youming Liu, Hefei (CN); Yunsong Qiu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 484 days.

(21) Appl. No.: 17/934,289

(22) Filed: Sep. 22, 2022

(65) Prior Publication Data

US 2023/0010014 A1 Jan. 12, 2023

(30) Foreign Application Priority Data

Jun. 23, 2022 (CN) .......................... 202210718795.4

(51) Int. Cl.
*H10B 12/00* (2023.01)

(52) U.S. Cl.
CPC ............ *H10B 12/09* (2023.02); *H10B 12/05* (2023.02); *H10B 12/482* (2023.02); *H10B 12/50* (2023.02)

(58) Field of Classification Search
CPC ...... H10B 12/09; H10B 12/05; H10B 12/482; H10B 12/50; H10B 12/488; H10B 12/315; H10B 99/00; H01L 21/76224; H10D 62/115
See application file for complete search history.

(56) References Cited

U.S. PATENT DOCUMENTS

| | | | |
|---|---|---|---|
| 5,244,824 A | 9/1993 | Sivan | |
| 6,376,303 B1 | 4/2002 | Seo | |
| 7,781,287 B2 * | 8/2010 | Yoon | H10D 30/693 438/270 |
| 8,058,168 B2 * | 11/2011 | Park | H10D 62/83 438/669 |
| 8,293,604 B2 | 10/2012 | Yoon | |
| 8,552,472 B2 * | 10/2013 | Kim | H10B 12/053 257/302 |
| 9,673,257 B1 | 6/2017 | Takaki | |

(Continued)

FOREIGN PATENT DOCUMENTS

| | | |
|---|---|---|
| CN | 101017825 A | 8/2007 |
| CN | 101740500 A | 6/2010 |

(Continued)

*Primary Examiner* — David Vu
(74) *Attorney, Agent, or Firm* — Syncoda LLC; Feng Ma

(57) ABSTRACT

A method for manufacturing a semiconductor structure includes the following operations. A substrate is provided, and is etched to form first isolation trenches in a cell region and a second isolation trench in a peripheral region. A first isolation dielectric layer is filled in each of the first isolation trenches and an isolation structure is formed in the second isolation trench. A patterned mask layer is formed on surfaces of the cell region and the peripheral region. The substrate and the first isolation dielectric layer are etched based on the patterned mask layer to form the third isolation trenches extending along a second direction. The third and first isolation trenches isolate multiple active pillars. The active pillar includes a first connecting end, a second connecting end and a channel region.

10 Claims, 21 Drawing Sheets

(56) References Cited

U.S. PATENT DOCUMENTS

| | | |
|---|---|---|
| 2006/0043471 A1 | 3/2006 | Tang |
| 2006/0046391 A1 | 3/2006 | Tang |
| 2007/0020819 A1 | 1/2007 | Tang |
| 2007/0048943 A1 | 3/2007 | Tang |
| 2007/0181925 A1 | 8/2007 | Yoon |
| 2007/0224753 A1 | 9/2007 | Tang |
| 2009/0072291 A1 | 3/2009 | Takaishi |
| 2009/0207649 A1 | 8/2009 | Tang |
| 2010/0120221 A1 | 5/2010 | Kang |
| 2010/0213525 A1 | 8/2010 | Masuoka |
| 2011/0104862 A1 | 5/2011 | Kadoya |
| 2011/0171796 A1 | 7/2011 | Tang |
| 2013/0011987 A1 | 1/2013 | Park |
| 2013/0056698 A1 | 3/2013 | Satoh |
| 2013/0075813 A1 | 3/2013 | Kadoya |
| 2015/0017767 A1 | 1/2015 | Masuoka et al. |
| 2015/0380548 A1 | 12/2015 | Wang et al. |
| 2016/0204251 A1 | 7/2016 | Masuoka et al. |
| 2017/0271510 A1 | 9/2017 | Wang et al. |
| 2017/0309632 A1 | 10/2017 | Masuoka et al. |
| 2017/0323977 A1 | 11/2017 | Cheng et al. |
| 2018/0083136 A1 | 3/2018 | Xie et al. |
| 2018/0096896 A1 | 4/2018 | Zhu |
| 2018/0175212 A1 | 6/2018 | Cheng et al. |
| 2019/0027570 A1 | 1/2019 | Ching et al. |
| 2019/0115438 A1 | 4/2019 | Ching et al. |
| 2019/0123053 A1 | 4/2019 | Masuoka et al. |
| 2019/0237581 A1 | 8/2019 | Saito et al. |
| 2019/0326395 A1 | 10/2019 | Ando et al. |
| 2020/0020812 A1 | 1/2020 | Masuoka et al. |
| 2020/0052084 A1 | 2/2020 | Ching et al. |
| 2021/0305431 A1 | 9/2021 | Ishimaru et al. |
| 2022/0069070 A1 | 3/2022 | Lai et al. |
| 2022/0102347 A1 | 3/2022 | Lai et al. |
| 2022/0139918 A1 | 5/2022 | Lee |
| 2022/0139920 A1 | 5/2022 | Lee |
| 2022/0199837 A1 | 6/2022 | Masuoka et al. |
| 2022/0262954 A1 | 8/2022 | Ishimaru et al. |

FOREIGN PATENT DOCUMENTS

| | | |
|---|---|---|
| CN | 101933135 A | 12/2010 |
| CN | 102867752 A | 1/2013 |
| CN | 105280698 A | 1/2016 |
| CN | 106252352 A | 12/2016 |
| CN | 107845578 A | 3/2018 |
| CN | 110476230 A | 11/2019 |
| CN | 110931429 A | 3/2020 |
| CN | 113078155 A | 7/2021 |
| CN | 113078156 A | 7/2021 |
| CN | 113451405 A | 9/2021 |
| CN | 114464535 A | 5/2022 |
| CN | 114497039 A | 5/2022 |
| EP | 1804286 A1 | 7/2007 |
| WO | 2013033267 A1 | 3/2013 |

\* cited by examiner

SEMICONDUCTOR STRUCTURE, METHOD FOR MANUFACTURING SAME

CROSS-REFERENCE TO RELATED APPLICATION

The present application claims priority to Chinese Patent Application No. 202210718795.4 filed on Jun. 23, 2022, the disclosure of which is hereby incorporated by reference in its entirety.

BACKGROUND

The existing memory device generally includes a memory cell region and a peripheral region. The memory cell region includes the most basic data memory cells, which are usually characterized by memory transistors. The peripheral region includes logic control unit, which can include high voltage P-type MOS transistor (HVPMOS), high voltage N-type MOS transistor (HVNMOS), low voltage P-type MOS transistor (LVPMOS), low voltage N-type MOS transistor (LVNMOS) and so on.

However, in traditional processes for manufacturing a memory device, the process for manufacturing the memory cell region and the process for manufacturing the peripheral region are independent of each other, which require independent masks. The whole process is cumbersome and costly. Therefore, how to reduce the process operations, improve the production efficiency of the memory device and save costs has become an urgent problem to be solved in related art.

SUMMARY

The disclosure relates to a technical field of semiconductors, in particular to a semiconductor structure and a method for manufacturing the same.

In an aspect, the embodiments of the disclosure provide a method for manufacturing a semiconductor structure, and the method includes the following operations.

A substrate is provided. The substrate includes a cell region and a peripheral region located at a periphery of the cell region.

The substrate is etched to form first isolation trenches in the cell region and second isolation trenches in the peripheral region. The first isolation trenches extend along a first direction.

A first isolation dielectric layer is filled in each of the first isolation trenches and an isolation structure is formed in each of the second isolation trenches.

A patterned mask layer is formed on a surface of the cell region and a surface of the peripheral region, and openings are provided in the patterned mask layer. The openings define shapes and positions of third isolation trenches.

The substrate and the first isolation dielectric layers are etched based on the patterned mask layer to form the third isolation trenches extending along a second direction. The third isolation trenches and the first isolation trenches jointly isolate a plurality of active pillars, each of the active pillars includes a first connecting end, a second connecting end and a channel region located between the first connecting end and the second connecting end.

In another aspect, the embodiments of the disclosure provide a semiconductor structure.

The semiconductor structure includes a substrate. The substrate includes a cell region and a peripheral region located at a periphery of the cell region.

First isolation trenches and third isolation trenches are provided in the cell region. The first isolation trenches and the third isolation trenches jointly isolate a plurality of active pillars, the first isolation trenches extend in a first direction and the third isolation trenches extends in a second direction, the first direction intersects the second direction, each of the active pillars includes a first connecting end, a second connecting end and a channel region located between the first connecting end and the second connecting end.

A second isolation trench is provided in the peripheral region. The second isolation trench and the first isolation trenches are formed based on a same photolithography etching process.

A first isolation dielectric layer is located in each of the first isolation trenches.

An isolation structure is located in the second isolation trench.

A second isolation dielectric layer is located in each of the third isolation trenches. The second isolation dielectric layers and the first isolation dielectric layers jointly cover the first connecting end of the active pillars.

BRIEF DESCRIPTION OF THE DRAWINGS

To more clearly illustrate the technical solution in the embodiments of the disclosure or conventional techniques, the drawings needed in the embodiments or the description of the conventional techniques will be briefly described below. It will be apparent that the drawings described below are only some embodiments of the disclosure, and other drawings may be obtained from these drawings without creative effort by a person of ordinary skill in the art.

Figure 5:
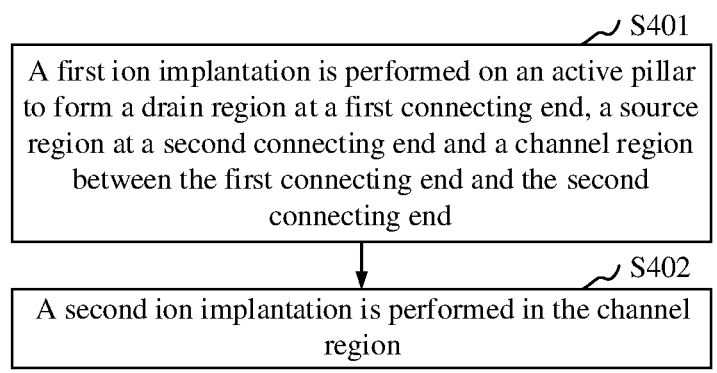

FIG. 5 is a flowchart after filling a first isolation dielectric layer and forming an isolation structure in an embodiment of the present disclosure.

Figure 2:
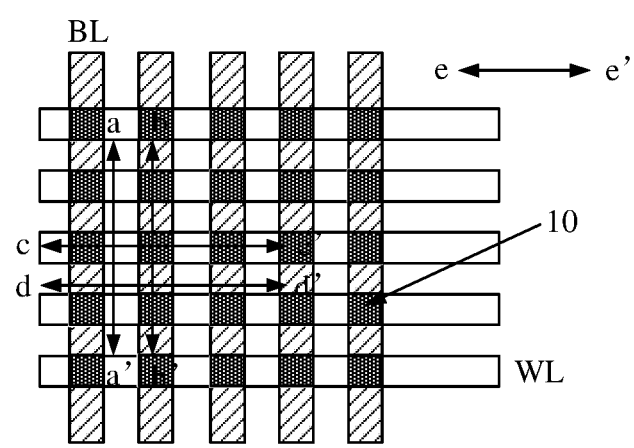
FIG. 2 is a schematic top-view structural diagram of a semiconductor structure manufactured by a method for manufacturing a semiconductor structure provided by an embodiment of the present disclosure.
Figure 6:
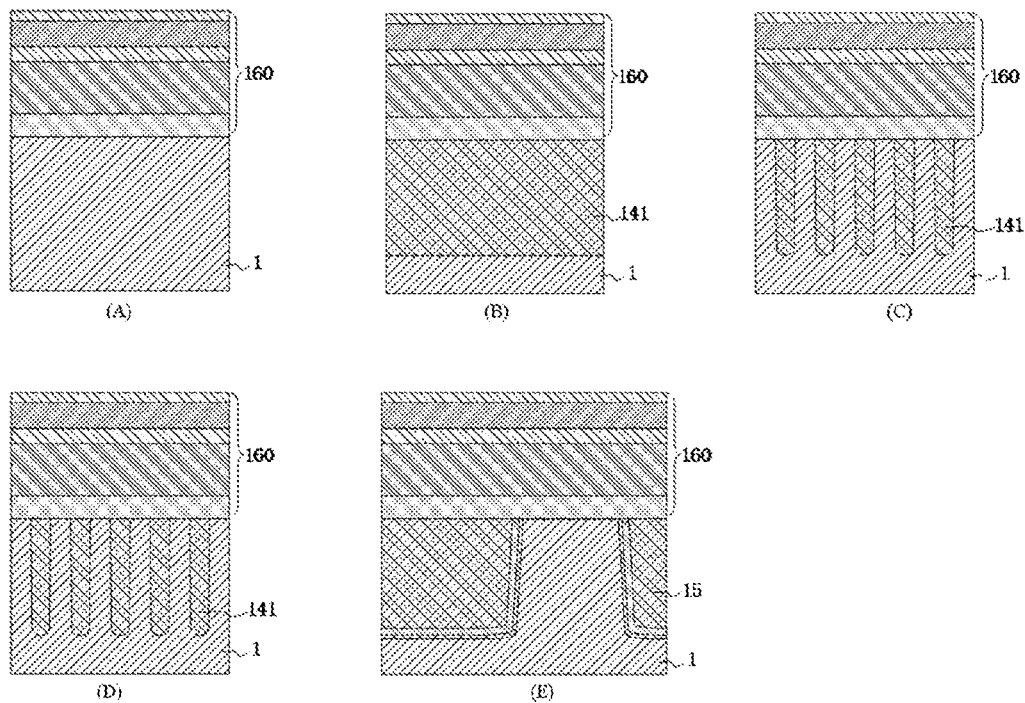

FIG. 6 includes panel (A) which is a schematic cross-sectional structural diagram of a structure obtained in the process of forming a patterned mask layer in an embodiment of the present disclosure along the aa' direction in FIG. 2, panel (B) which is a schematic cross-sectional structural diagram of a structure obtained in the process of forming a patterned mask layer in an embodiment of the present disclosure along the bb' direction in FIG. 2, panel (C) which is a schematic cross-sectional structural diagram of a structure obtained in the process of forming a patterned mask layer in an embodiment of the present disclosure along the cc' direction in FIG. 2, panel (D) which is a schematic cross-sectional structural diagram of a structure obtained in the process of forming a patterned mask layer in an embodiment of the present disclosure along the dd' direction in FIG. 2, and panel (E) which is a schematic cross-sectional structural diagram of a structure obtained in the process of forming a patterned mask layer in an embodiment of the present disclosure along the ee' direction in FIG. 2.

Figure 7:
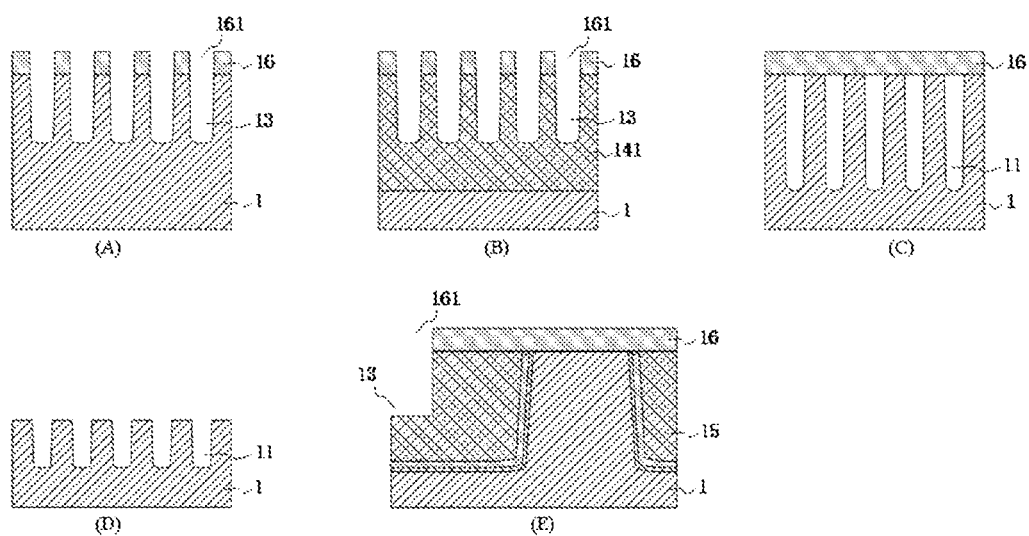

FIG. 7 includes panel (A) which is a schematic cross-sectional structural diagram of a structure obtained in S6 in an embodiment of the present disclosure along the aa' direction in FIG. 2, panel (B) which is a schematic cross-sectional structural diagram of a structure obtained in S6 in an embodiment of the present disclosure along the bb' direction in FIG. 2, panel (C) which is a schematic cross-sectional structural diagram of a structure obtained in S6 in an embodiment of the present disclosure along the cc' direction in FIG. 2, panel (D) which is a schematic cross-sectional structural diagram of a structure obtained in S6 in an embodiment of the present disclosure along the dd' direction in FIG. 2, and panel (E) which is a schematic cross-sectional structural diagram of a structure obtained in S6 in an embodiment of the present disclosure along the ee' direction in FIG. 2.

Figure 8:
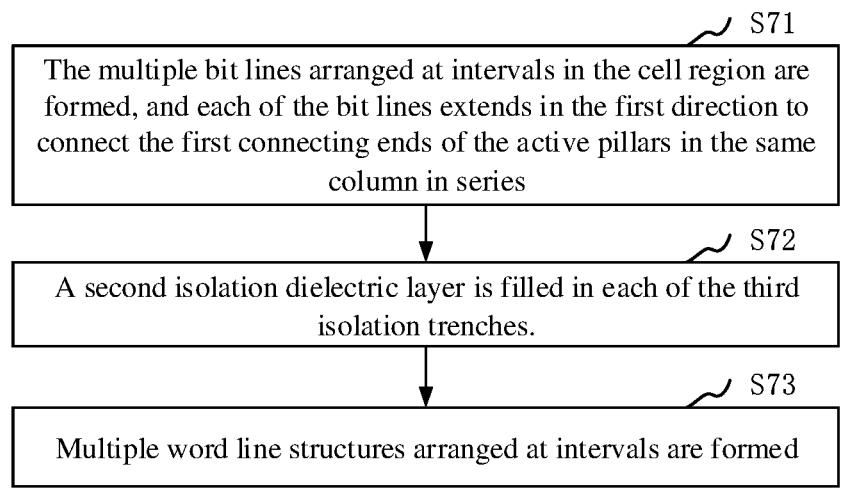

FIG. 8 is a flowchart of forming third isolation trenches in an embodiment of the present disclosure.

Figure 9:
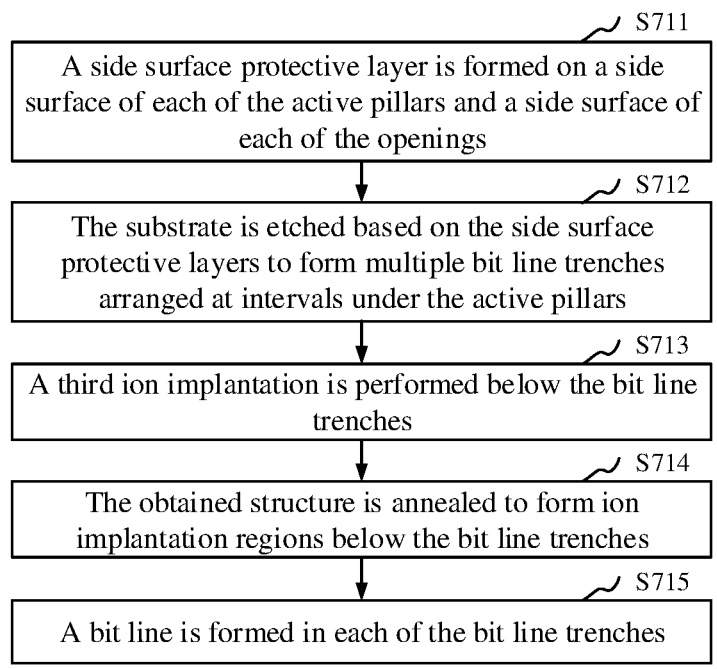

FIG. 9 is a flowchart of forming multiple bit lines arranged at intervals in an embodiment of the present disclosure.

Figure 10:
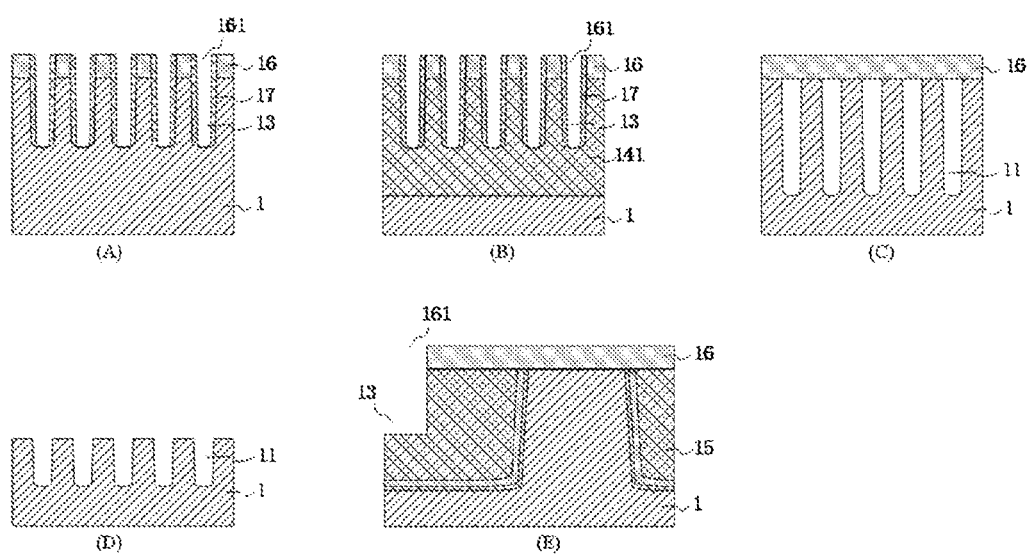

FIG. 10 includes panel (A) which is a schematic cross-sectional structural diagram of a structure obtained in S711 in an embodiment of the present disclosure along the aa' direction in FIG. 2, panel (B) which is a schematic cross-sectional structural diagram of a structure obtained in S711 in an embodiment of the present disclosure along the bb' direction in FIG. 2, panel (C) which is a schematic cross-sectional structural diagram of a structure obtained in S711 in an embodiment of the present disclosure along the cc' direction in FIG. 2, panel (D) which is a schematic cross-sectional structural diagram of a structure obtained in S711 in an embodiment of the present disclosure along the dd' direction in FIG. 2, and panel (E) which is a schematic cross-sectional structural diagram of a structure obtained in S711 in an embodiment of the present disclosure along the ee' direction in FIG. 2.

Figure 11:
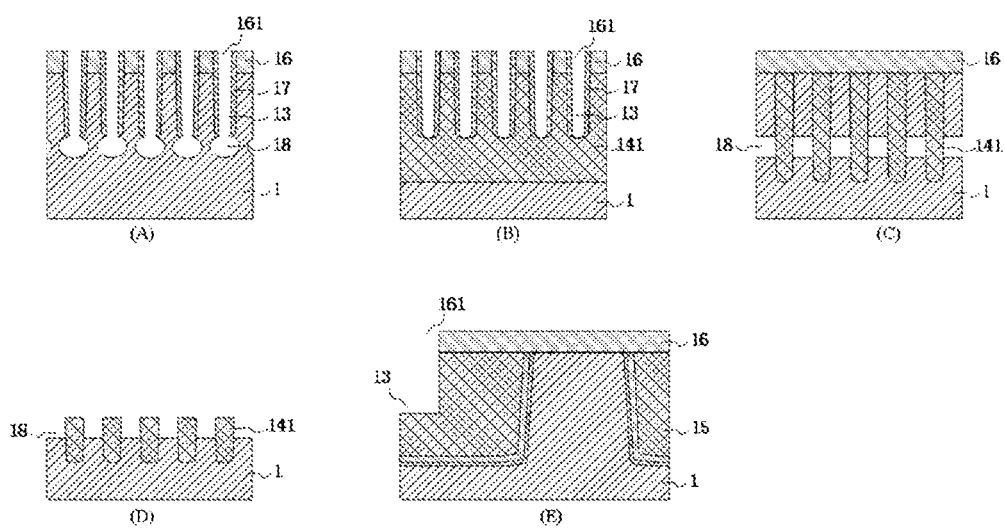

FIG. 11 includes panel (A) which is a schematic cross-sectional structural diagram of a structure obtained in S712 in an embodiment of the present disclosure along the aa' direction in FIG. 2, panel (B) which is a schematic cross-sectional structural diagram of a structure obtained in S712 in an embodiment of the present disclosure along the bb' direction in FIG. 2, panel (C) which is a schematic cross-sectional structural diagram of a structure obtained in S712 in an embodiment of the present disclosure along the cc' direction in FIG. 2, panel (D) which is a schematic cross-sectional structural diagram of a structure obtained in S712 in an embodiment of the present disclosure along the dd' direction in FIG. 2, and panel (E) which is a schematic cross-sectional structural diagram of a structure obtained in S712 in an embodiment of the present disclosure along the ee' direction in FIG. 2.

Figure 12:
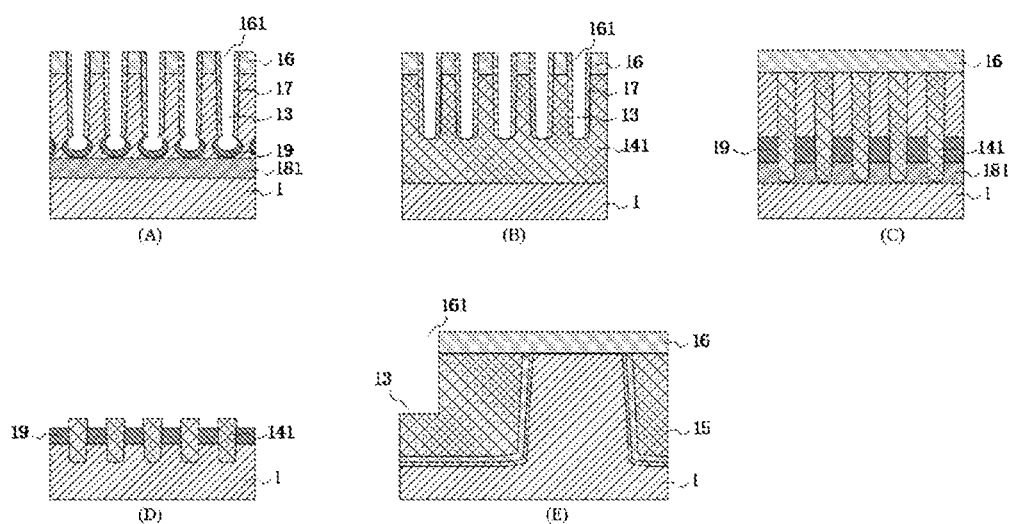

FIG. 12 includes panel (A) which is a schematic cross-sectional structural diagram of a structure obtained in S715 in an embodiment of the present disclosure along the aa' direction in FIG. 2, panel (B) which is a schematic cross-sectional structural diagram of a structure obtained in S715 in an embodiment of the present disclosure along the bb' direction in FIG. 2, panel (C) which is a schematic cross-sectional structural diagram of a structure obtained in S715 in an embodiment of the present disclosure along the cc' direction in FIG. 2, panel (D) which is a schematic cross-sectional structural diagram of a structure obtained in S715 in an embodiment of the present disclosure along the dd' direction in FIG. 2, and panel (E) which is a schematic cross-sectional structural diagram of a structure obtained in S715 in an embodiment of the present disclosure along the ee' direction in FIG. 2.

Figure 13:
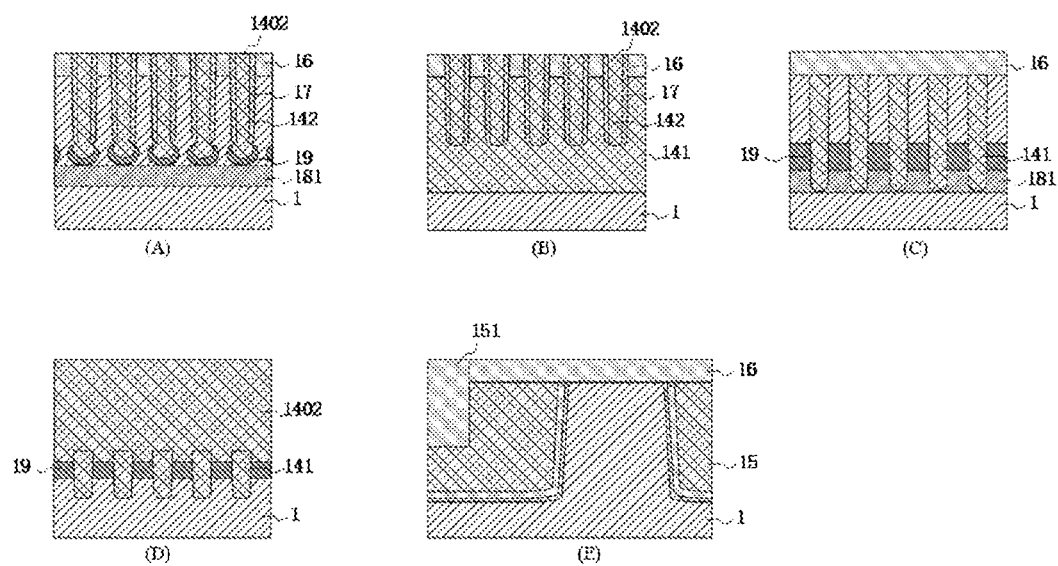

FIG. 13 includes panel (A) which is a schematic cross-sectional structural diagram of a structure obtained after forming a second isolation dielectric material layer in an embodiment of the present disclosure along the aa' direction in FIG. 2, panel (B) which is a schematic cross-sectional structural diagram of a structure obtained after forming a second isolation dielectric material layer in an embodiment of the present disclosure along the bb' direction in FIG. 2, panel (C) which is a schematic cross-sectional structural diagram of a structure obtained after forming a second isolation dielectric material layer in an embodiment of the present disclosure along the cc' direction in FIG. 2, panel (D) which is a schematic cross-sectional structural diagram of a structure obtained after forming a second isolation dielectric material layer in an embodiment of the present disclosure along the dd' direction in FIG. 2, and panel (E) which is a schematic cross-sectional structural diagram of a structure obtained after forming a second isolation dielectric material layer in an embodiment of the present disclosure along the ee' direction in FIG. 2.

Figure 14:
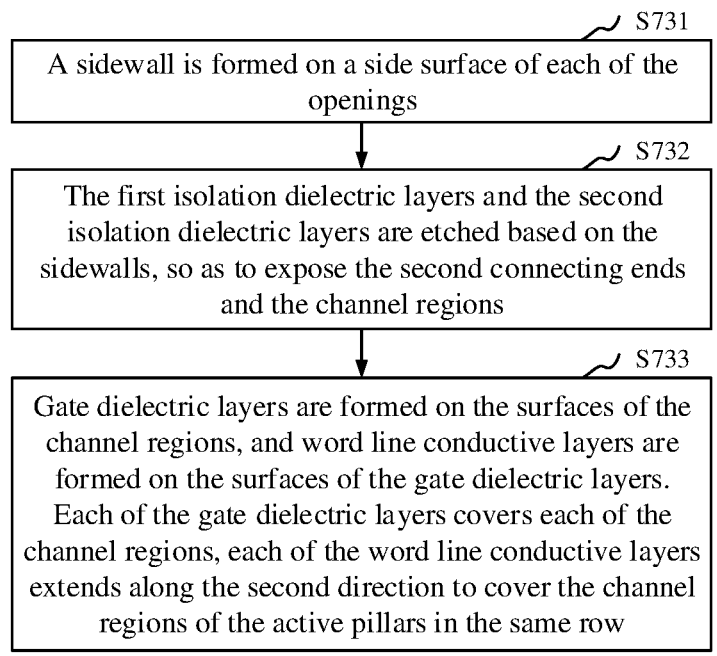

FIG. 14 is a flowchart of forming word line structures in an embodiment of the present disclosure.

Figure 15:
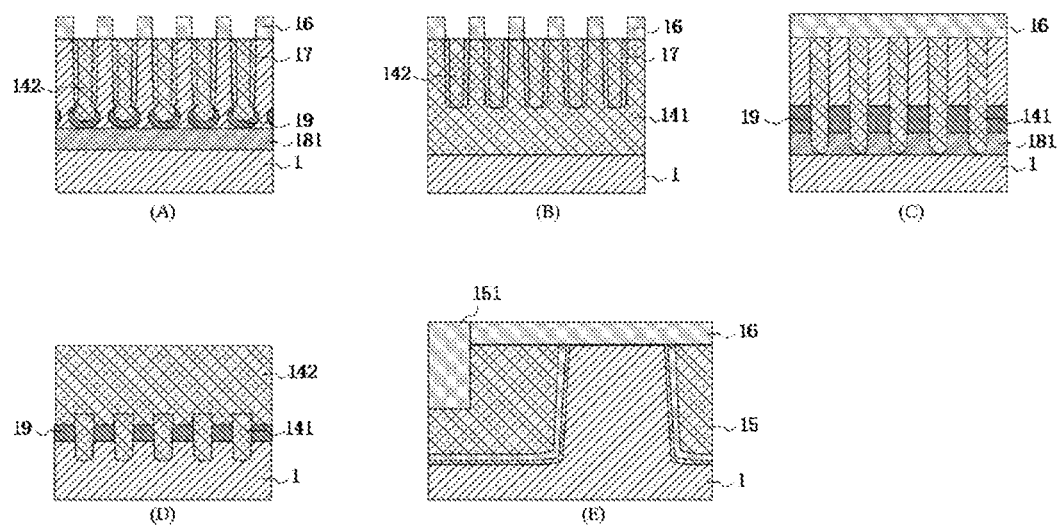

FIG. 15 includes panel (A) which is a schematic cross-sectional structural diagram of a structure obtained in S72 in an embodiment of the present disclosure along the aa' direction in FIG. 2, panel (B) which is a schematic cross-sectional structural diagram of a structure obtained in S72 in an embodiment of the present disclosure along the bb' direction in FIG. 2, panel (C) which is a schematic cross-sectional structural diagram of a structure obtained in S72 in an embodiment of the present disclosure along the cc' direction in FIG. 2, panel (D) which is a schematic cross-sectional structural diagram of a structure obtained in S72 in an embodiment of the present disclosure along the dd' direction in FIG. 2, and panel (E) which is a schematic cross-sectional structural diagram of a structure obtained in S72 in an embodiment of the present disclosure along the ee' direction in FIG. 2.

Figure 16:
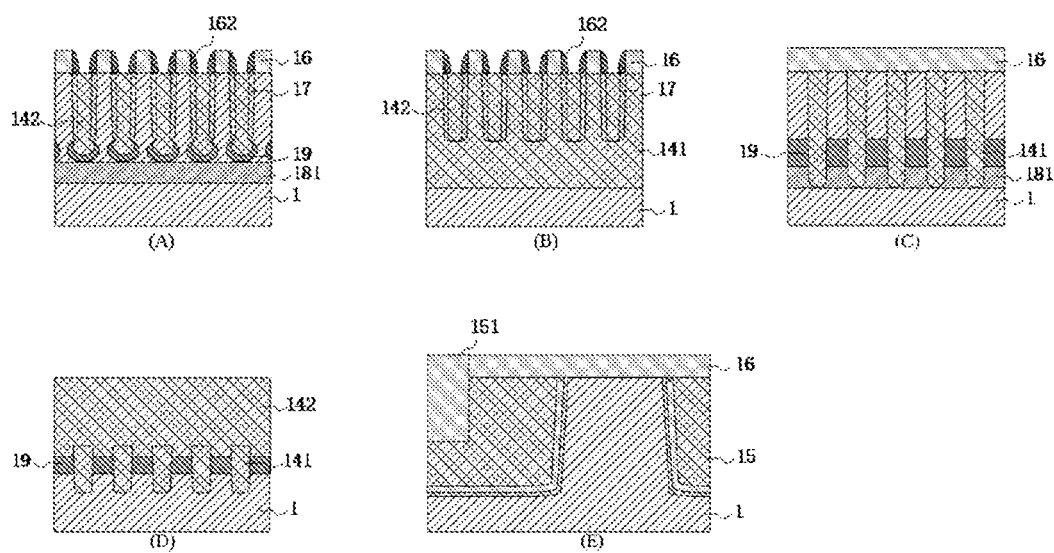

FIG. 16 includes panel (A) which is a schematic cross-sectional structural diagram of a structure obtained in S731 in an embodiment of the present disclosure along the aa' direction in FIG. 2, panel (B) which is a schematic cross-sectional structural diagram of a structure obtained in S731 in an embodiment of the present disclosure along the bb' direction in FIG. 2, panel (C) which is a schematic cross-sectional structural diagram of a structure obtained in S731 in an embodiment of the present disclosure along the cc' direction in FIG. 2, panel (D) which is a schematic cross-sectional structural diagram of a structure obtained in S731 in an embodiment of the present disclosure along the dd' direction in FIG. 2, and panel (E) which is a schematic cross-sectional structural diagram of a structure obtained in S731 in an embodiment of the present disclosure along the ee' direction in FIG. 2.

Figure 17:
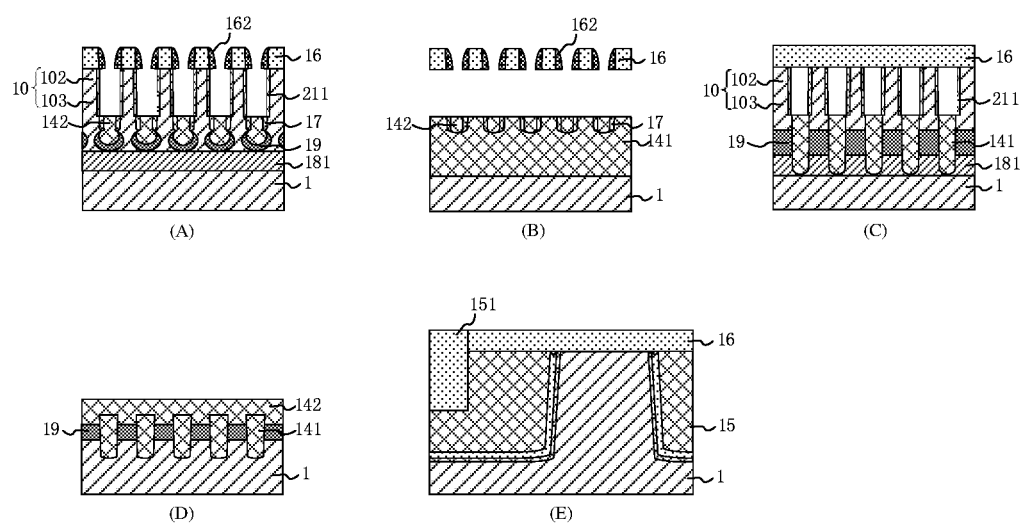

FIG. 17 includes panel (A) which is a schematic cross-sectional structural diagram of a structure obtained in S732 in an embodiment of the present disclosure along the aa' direction in FIG. 2, panel (B) which is a schematic cross-sectional structural diagram of a structure obtained in S732 in an embodiment of the present disclosure along the bb' direction in FIG. 2, panel (C) which is a schematic cross-sectional structural diagram of a structure obtained in S732 in an embodiment of the present disclosure along the cc' direction in FIG. 2, panel (D) which is a schematic cross-sectional structural diagram of a structure obtained in S732 in an embodiment of the present disclosure along the dd' direction in FIG. 2, and panel (E) which is a schematic cross-sectional structural diagram of a structure obtained in S732 in an embodiment of the present disclosure along the ee' direction in FIG. 2.

Figure 18:
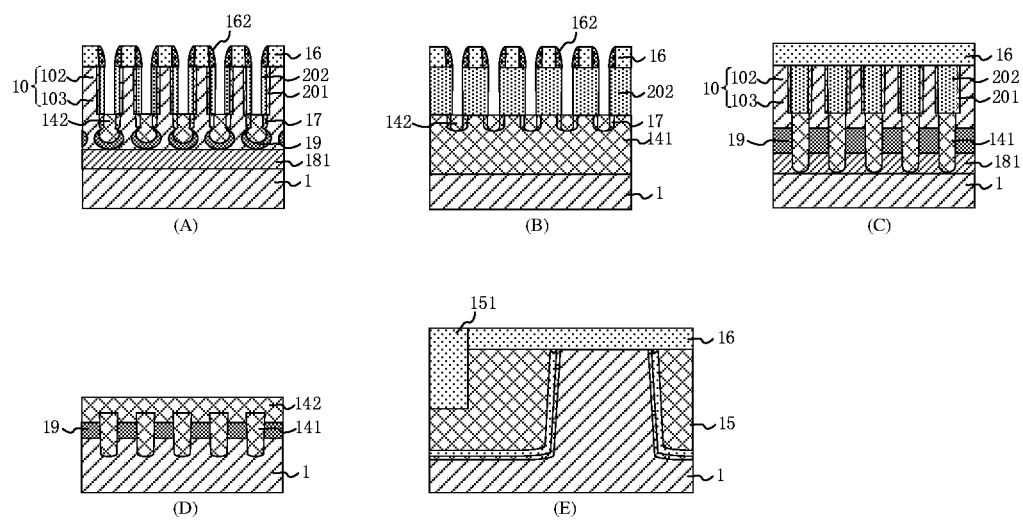

FIG. 18 includes panel (A) which is a schematic cross-sectional structural diagram of a structure obtained in S7332 in an embodiment of the present disclosure along the aa' direction in FIG. 2, panel (B) which is a schematic cross-sectional structural diagram of a structure obtained in S7332 in an embodiment of the present disclosure along the bb' direction in FIG. 2, panel (C) which is a schematic cross-sectional structural diagram of a structure obtained in S7332 in an embodiment of the present disclosure along the cc' direction in FIG. 2, panel (D) which is a schematic cross-sectional structural diagram of a structure obtained in S7332 in an embodiment of the present disclosure along the dd' direction in FIG. 2, and panel (E) which is a schematic cross-sectional structural diagram of a structure obtained in S7332 in an embodiment of the present disclosure along the ee' direction in FIG. 2.

Figure 19:
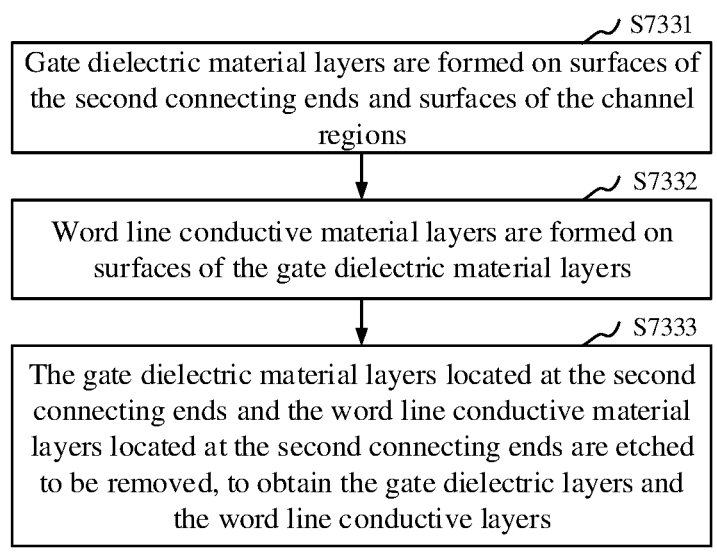

FIG. 19 is a flowchart of forming gate dielectric layers in an embodiment of the present disclosure.

Figure 20:
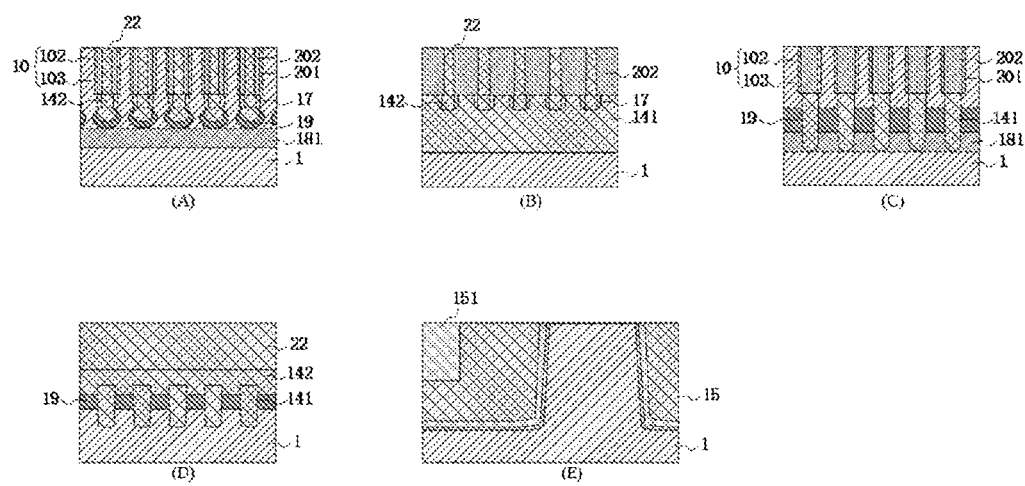

FIG. 20 includes panel (A) which is a schematic cross-sectional structural diagram of a structure obtained after forming isolation dielectric material layers between the word line conductive material layers and removing the patterned mask layer and the side walls in an embodiment of the present disclosure along the aa' direction in FIG. 2, panel (B) which is a schematic cross-sectional structural diagram of a structure obtained after forming isolation dielectric material layers between the word line conductive material layers and removing the patterned mask layer and the side walls in an embodiment of the present disclosure along the bb' direction in FIG. 2, panel (C) which is a schematic cross-sectional structural diagram of a structure obtained after forming isolation dielectric material layers between the word line conductive material layers and removing the patterned mask layer and the side walls in an embodiment of the present disclosure along the cc' direction in FIG. 2, panel (D) which is a schematic cross-sectional structural diagram of a structure obtained after forming isolation dielectric material layers between the word line conductive material layers and removing the patterned mask layer and the side walls in an embodiment of the present disclosure along the dd' direction in FIG. 2, and panel (E) which is a schematic cross-sectional structural diagram of a structure obtained after forming isolation dielectric material layers between the word line conductive material layers and removing the patterned mask layer and the side walls in an embodiment of the present disclosure along the ee' direction in FIG. 2.

Figure 21:
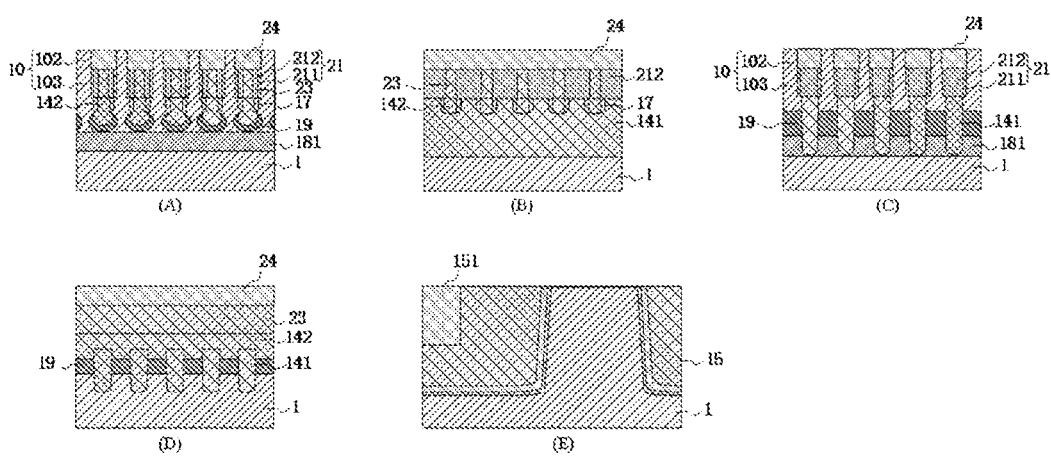

FIG. 21 includes panel (A) which is a schematic cross-sectional structural diagram of a structure obtained after forming an insulating dielectric layer in an embodiment of the present disclosure along the aa' direction in FIG. 2, panel (B) which is a schematic cross-sectional structural diagram of a structure obtained after forming an insulating dielectric layer in an embodiment of the present disclosure along the bb' direction in FIG. 2, panel (C) which is a schematic cross-sectional structural diagram of a structure obtained after forming an insulating dielectric layer in an embodiment of the present disclosure along the cc' direction in FIG. 2, panel (D) which is a schematic cross-sectional structural diagram of a structure obtained after forming an insulating dielectric layer in an embodiment of the present disclosure along the dd' direction in FIG. 2, and panel (E) which is a schematic cross-sectional structural diagram of a structure obtained after forming an insulating dielectric layer in an embodiment of the present disclosure along the ee' direction in FIG. 2.

DETAILED DESCRIPTION

In order to facilitate the understanding of the disclosure, a more complete description will be given below with reference to the relevant drawings. The preferred embodiment of the disclosure is given in the attached drawings. However, the disclosure may be implemented in many different forms and is not limited to the embodiments described herein. Rather, these embodiments are provided to make the disclosure more thorough and comprehensive.

Unless otherwise defined, all technical and scientific terms used herein have the same meanings as those commonly understood by those skilled in the art of the disclosure. Terms used in the specification of the disclosure are for the purpose of describing specific embodiments only, and are not intended to limit the disclosure.

It should be understood that when an element or layer is referred to as "on" another element or layer, it may be directly above, adjacent to, connected to, or coupled to the other element or layer, or may exist an intervening element or layer. It should be understood that, although the terms first, second, etc. may be used to describe various elements, components, regions, layers, doping types and/or portions, the elements, components, regions, layers, doping types and/or portions should not be limited by these terms. These terms are used only to distinguish one element, component, region, layer, doping type or portion from another element, component, region, layer, doping type or portion. Accordingly, a first element, component, region, layer, doping type, or portion discussed below may be represented as a second element, component, region, layer, or portion without departing from the teachings of the present disclosure. For example, a first isolation dielectric layer may be referred to as a second isolation dielectric layer, and similarly the second isolation dielectric layer may be referred to as the first isolation dielectric layer. The first isolation dielectric layer and the second isolation dielectric layer are different isolation dielectric layers.

Spatially relational terms such as "below", "above" may be used herein for describing a relationship between one element or feature and another element or feature illustrated in the figures. It should be understood that, the spatial relationship terms also include different orientations of devices in use and operation, in addition to the orientations shown in the figures. For example, if a device in the figures is flipped, then the element or feature described as "below" another element or feature will be oriented "above" the another element or feature. Therefore, the exemplary terms "above" and "below" may include both upper and lower orientations. Moreover, the device may be additionally oriented (rotated 90 degrees or otherwise) and the spatial descriptors used herein are interpreted accordingly.

As used herein, the singular forms of "a", "an" and "said/the" also include the plural forms, unless the context clearly indicates otherwise. It should also be understood that when the terms "compose" and/or "include" are used in this specification, it can determine the presence of said features, integers, steps, operations, elements and/or components, but do not exclude the presence or addition of one or more other features, integers, steps, operations, elements, components and/or groups.

The embodiments of the disclosure are described herein with reference to schematic cross-sectional structural diagram of ideal embodiments (and intermediate structures) in the present disclosure, so that variations in the shapes shown due to, for example, manufacturing techniques and/or tolerances can be anticipated. Accordingly, the embodiments of the present disclosure should not be limited to the specific shapes of the regions shown herein, but include shape deviations due to, for example, manufacturing techniques. Accordingly, the regions shown in the figures are schematic in nature and their shapes do not represent the actual shapes of the regions of the device, and do not limit the scope of the present disclosure.

The embodiments of the disclosure provide a semiconductor structure and a method for manufacturing the same.

Figure 1:
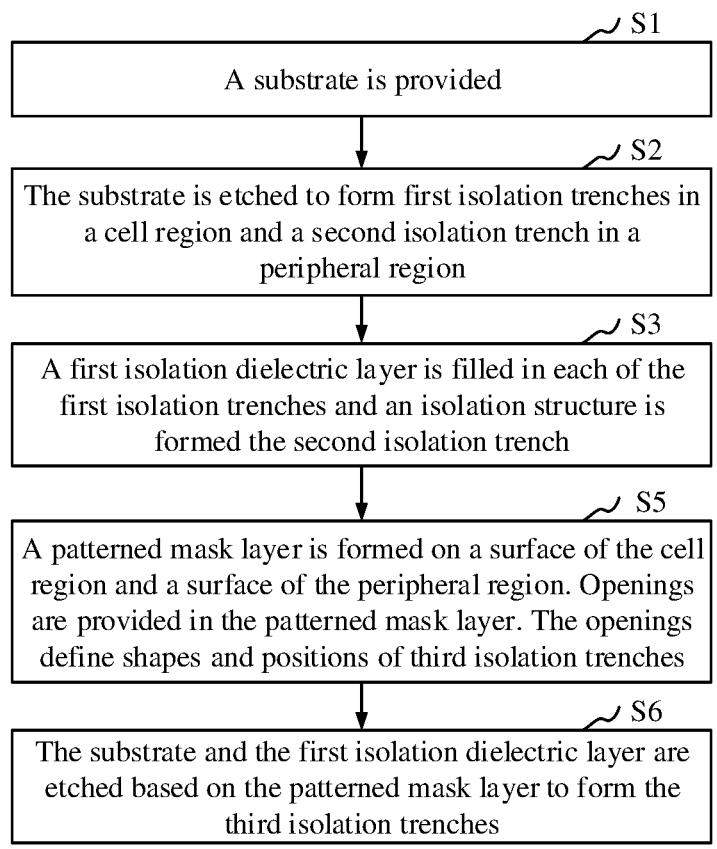
FIG. 1 is a flowchart of a method for manufacturing a semiconductor structure provided by an embodiment of the disclosure.

Referring to FIG. 1, in one of the embodiments, a method for manufacturing a semiconductor structure includes the following operations.

In S1, a substrate is provided, and the substrate includes a cell region and a peripheral region located at a periphery of the cell region.

In S2, the substrate is etched to form first isolation trenches in the cell region and a second isolation trench in the peripheral region. The first isolation trenches extend along a first direction.

In S3, a first isolation dielectric layer is filled in each of the first isolation trenches and an isolation structure is formed the second isolation trench.

In S5, a patterned mask layer is formed on a surface of the cell region and a surface of the peripheral region. Openings are provided in the patterned mask layer. The openings define shapes and positions of third isolation trenches.

In S6, the substrate and the first isolation dielectric layer are etched based on the patterned mask layer to form the third isolation trenches. Each of the third isolation trenches extends along a second direction. The third isolation trenches and the first isolation trenches jointly isolate multiple active pillars. Each of the active pillars includes a first connecting end, a second connecting end and a channel region located between the first connecting end and the second connecting end.

In the method for manufacturing a semiconductor provided by the above-mentioned embodiment, it does not operate separately for different regions, but processes simultaneously the cell region and the peripheral region in the manufacturing process of the cell region and the peripheral region. While forming the first isolation trenches in the cell region, the second isolation trench is formed in the peripheral region. During forming the second isolation trench, there is no need to form an additional mask at the peripheral region, thereby reducing necessary process operations in the manufacturing process, improving production efficiency and reducing production cost.

Referring to FIG. 2, FIG. 2 shows aa' direction, bb' direction cc' direction, dd' direction and ee' direction in the present disclosure. It is to be noted that, aa' direction, bb' direction, cc' direction and dd' direction are located in the cell region of the substrate, and ee' direction is located in the peripheral region of the substrate.

Figure 3:
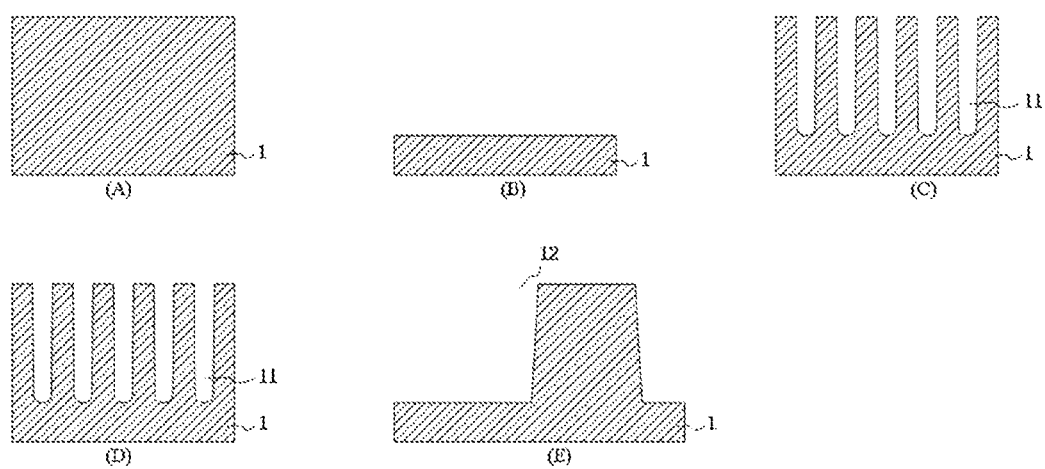
FIG. 3 includes panel (A) which is a schematic cross-sectional structural diagram of a structure obtained in S2 in an embodiment of the present disclosure along the aa' direction in FIG. 2, panel (B) which is a schematic cross-sectional structural diagram of a structure obtained in S2 in an embodiment of the present disclosure along the bb' direction in FIG. 2, panel (C) which is a schematic cross-sectional structural diagram of a structure obtained in S2 in an embodiment of the present disclosure along the cc' direction in FIG. 2, panel (D) which is a schematic cross-sectional structural diagram of a structure obtained in S2 in an embodiment of the present disclosure along the dd' direction in FIG. 2, and panel (E) which is a schematic cross-sectional structural diagram of a structure obtained in S2 in an embodiment of the present disclosure along the ee' direction in FIG. 2.

Referring to FIG. 3, in S1, a substrate 1 is provided. The substrate 1 includes a cell region and a peripheral region located at a periphery of the cell region.

In the embodiment of this disclosure, the material of the substrate 1 is not specifically limited. For example, the substrate 1 may include, but is not limited to, any one or several of silicon substrate, sapphire substrate, glass substrate, silicon carbide substrate, gallium nitride substrate, gallium arsenide substrate, and the like.

Referring further to FIG. 3, Panel (A) in FIG. 3 shows a schematic cross-sectional structural diagram of a structure obtained in S2 along the aa' direction in FIG. 2, Panel (B) in FIG. 3 shows a schematic cross-sectional structural diagram of a structure obtained in S2 along the bb' direction in FIG. 2, Panel (C) in FIG. 3 shows a schematic cross-sectional structural diagram of a structure obtained in S2 along the cc' direction in FIG. 2, Panel (D) in FIG. 3 shows a schematic cross-sectional structural diagram of a structure obtained in S2 along the dd' direction in FIG. 2, and Panel (E) in FIG. 3 shows a schematic cross-sectional structural diagram of a structure obtained in S2 along the ee' direction in FIG. 2.

In S2, the substrate 1 is etched to form first isolation trenches 11 in the cell region and a second isolation trench 12 in the peripheral region. The first isolation trenches 11 extend in a first direction.

Figure 4:
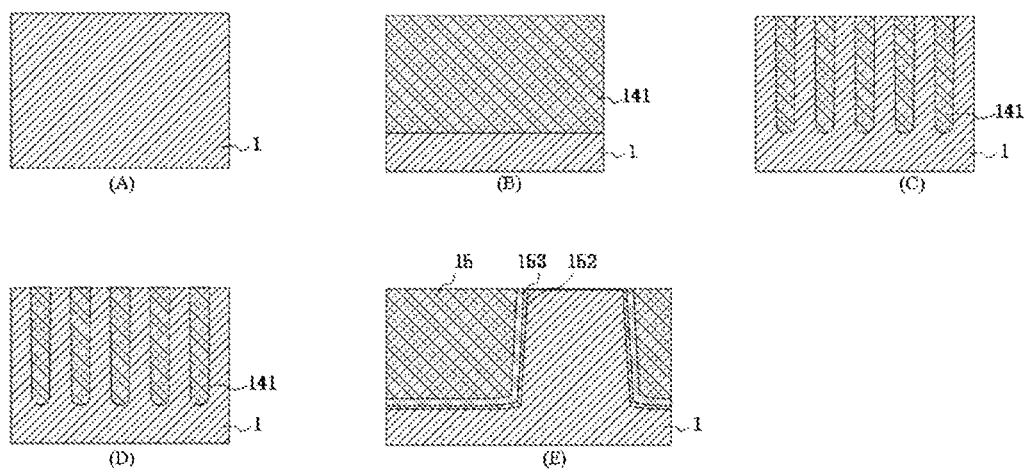
FIG. 4 includes panel (A) which is a schematic cross-sectional structural diagram of a structure obtained in S3 in an embodiment of the present disclosure along the aa' direction in FIG. 2, panel (B) which is a schematic cross-sectional structural diagram of a structure obtained in S3 in an embodiment of the present disclosure along the bb' direction in FIG. 2, panel (C) which is a schematic cross-sectional structural diagram of a structure obtained in S3 in an embodiment of the present disclosure along the cc' direction in FIG. 2, panel (D) which is a schematic cross-sectional structural diagram of a structure obtained in S3 in an embodiment of the present disclosure along the dd' direction in FIG. 2, and panel (E) which is a schematic cross-sectional structural diagram of a structure obtained in S3 in an embodiment of the present disclosure along the ee' direction in FIG. 2.

Referring to FIG. 4, Panel (A) in FIG. 4 shows a schematic cross-sectional diagram of a structure obtained in S3 along the aa' direction in FIG. 2, Panel (B) in FIG. 4 shows a schematic cross-sectional structural diagram of a structure obtained in S3 along the bb' direction in FIG. 2, Panel (C) in FIG. 4 shows a schematic cross-sectional structural diagram of a structure obtained in S3 along the cc' direction in FIG. 2, Panel (D) in FIG. 4 shows a schematic cross-sectional structural diagram of a structure obtained in S3 along the dd' direction in FIG. 2, and Panel (E) in FIG. 4 shows a schematic cross-sectional structural diagram of a structure obtained in S3 along the ee' direction in FIG. 2.

In S3, a first isolation dielectric layer 141 is filled in each of the first isolation trenches 11 and an isolation structure 15 is formed in the second isolation trench 12.

The material of the first isolation dielectric layer 141 is not specifically limited in the disclosure. For example, the first isolation dielectric layer 141 may include, but is not limited to, a first oxide layer.

For example, the process of filling the first isolation dielectric layer 141 in the first isolation trenches 11 may be performed by the following operations. For example, a first oxide material layer is formed in the first isolation trenches 11. The top of the first oxide material layer is higher than the upper surface of the substrate 1. After the first oxide material layer is formed, a partial height of the first oxide material layer is removed, so that the top of the remaining first oxide material layer is flush with the upper surface of the substrate 1, and the remaining first oxide material layer is used as the first oxide layers. The partial height of the first oxide material layer may be removed by, but is not limited to, a chemical-mechanical polishing (CMP) process.

Referring further to Panel (E) in FIG. 4, for example, a pad oxide layer 152 and a nitride layer 153 may also be formed in the second isolation trench 12.

The manufacturing method provided by the above-mentioned example includes an operation of performing a shallow trench isolation process on the substrate 1 to form a shallow isolation trench. The pad oxide layer 152 and the nitride layer 153 may be deposited sequentially in the region outside of the shallow isolation trench on substrate 1, and the isolation structure 15 may be formed on the surface of the nitride layer 153 away from the pad oxide layer 152.

Referring to FIG. 5, FIG. 5 shows a flowchart after a filling first isolation dielectric layer 141 and forming an isolation structure 15 in an embodiment of the present disclosure.

In one of the embodiments, after filling the first isolation dielectric layer 141 and forming the isolation structure 15 in the second isolation trench 12, and before forming the patterned mask layer on the surfaces of the cell region and the peripheral region, the method for manufacturing a semiconductor structure further may include the following operations.

In S401, a first ion implantation is performed on an active pillar to form a drain region at a first connecting end, a source region at a second connecting end and a channel region between the first connecting end and the second connecting end.

In S402, a second ion implantation is performed in the channel region.

Referring to FIG. 6, Panel (A) in FIG. 6 shows a schematic cross-sectional structural diagram of a structure obtained in the process for forming a patterned mask layer along the aa' direction in FIG. 2, Panel (B) in FIG. 6 shows a schematic cross-sectional structural diagram of a structure obtained in the process for forming a patterned mask layer along the bb' direction in FIG. 2, Panel (C) in FIG. 6 shows a schematic cross-sectional structural diagram of a structure obtained in the process for forming a patterned mask layer along the cc' direction in FIG. 2, Panel (D) in FIG. 6 shows a schematic cross-sectional structural diagram of a structure obtained in the process for forming a patterned mask layer along the dd' direction in FIG. 2, and Panel (E) in FIG. 6 shows a schematic cross-sectional structural diagram of a structure obtained in the process for forming a patterned mask layer along the ee' direction in FIG. 2.

The patterned mask layer (it will be described later) may be formed by the following operations. For example, a mask stack 160 is formed on the surfaces of the cell region and the peripheral region. After the mask stack 160 is formed, each layer of the mask stack 160 is etched and patterned from top to bottom, to obtain the patterned mask layer.

The material of the mask stack 160 is not specifically limited in the disclosure. For example, the mask stack 160 may include, but is not limited to, a silicon nitride layer, an amorphous carbon (ACL) layer, a silicon oxynitride (SiON) layer, a spin-on hard-mask (SOH) layer, and the like.

In one of the embodiments, the mask stack 160 includes a silicon nitride layer, an amorphous carbon layer, a first silicon oxynitride layer, a spin-on hard-mask layer, and a second silicon oxynitride layer stacked from bottom to top sequentially. In the embodiment, during etching to pattern the mask stack 160, a mask pattern is transferred from top to bottom based on the mask stack 160. During the transfer process, the second silicon oxynitride layer, the spin-on hard-mask layer, the first silicon oxynitride layer and the amorphous carbon layer are gradually removed, and finally the patterned silicon nitride layer is obtained. The patterned silicon nitride layer remains as the patterned mask layer.

Referring to FIG. 7, in S5, the patterned mask layer 16 is formed on the surfaces of the cell region and the peripheral region. The patterned mask layer 16 has the openings 161, which can define the shapes and positions of the third isolation trenches 13.

Referring further to FIG. 7, Panel (A) in FIG. 7 shows a schematic cross-sectional structural diagram of a structure obtained in S6 along the aa' direction in FIG. 2, Panel (B) in FIG. 7 shows a schematic cross-sectional structural diagram of a structure obtained in S6 along the bb' direction in FIG. 2, Panel (C) in FIG. 7 shows a schematic cross-sectional structural diagram of a structure obtained in S6 along the cc' direction in FIG. 2, Panel (D) in FIG. 7 shows a schematic cross-sectional structural diagram of a structure obtained in S6 along the dd' direction in FIG. 2, and Panel (E) in FIG. 7 shows a schematic cross-sectional structural diagram of a structure obtained in S6 along the ee' direction in FIG. 2.

In S6, the substrate 1 and the first isolation dielectric layers 141 are etched based on the patterned mask layer 16, to form the third isolation trenches 13 extending in the second direction. The third isolation trenches 13 and the first isolation trenches 11 may jointly isolate the multiple active pillars 10.

Each of the active pillars 10 may include the first connecting end, the second connecting end and the channel region located between the first connecting end and the second connecting end.

As shown in FIG. 7, in one of the embodiments, the third isolation trenches 13 may extend into the isolation structure 15 of the peripheral region.

Possible operations after forming the third isolation trenches 13 are described below with reference to FIGS. 8 to 21.

As shown in FIG. 8, in one of the embodiments, after etching the substrate 1 and the first isolation dielectric layers 141 based on the patterned mask layer 16 to form the third isolation trenches 13, the method for manufacturing a semiconductor structure further includes the following operations.

In S71, the multiple bit lines (BL) arranged at intervals in the cell region are formed.

The bit lines 19 are located below the active pillars 10 and each of the bit lines 19 extends in the first direction to connect the first connecting ends of the active pillars 10 in the same column in series.

In S72, a second isolation dielectric layer 142 is filled in each of the third isolation trenches 13.

In S73, multiple word line (WL) structures 21 arranged at intervals are formed. Each of the word line structures 21 extends along the second direction to cover the channel regions 103 of the active pillars 10 in the same row.

As shown in FIG. 9, in one of the embodiments, the multiple bit lines 19 arranged at intervals in the cell region may be formed by the following operations.

In S711, a side surface protective layer 17 is formed on a side surface of each of the active pillars 10 and a side surface of each of the openings 161.

As shown in FIG. 10, Panel (A) in FIG. 10 shows a schematic cross-sectional structural diagram of a structure obtained in S711 along the aa' direction in FIG. 2, Panel (B) in FIG. 10 shows a schematic cross-sectional structural diagram of a structure obtained in S711 along the bb' direction in FIG. 2, Panel (C) in FIG. 10 shows a schematic cross-sectional structural diagram of a structure obtained in S711 along the cc' direction in FIG. 2, Panel (D) in FIG. 10 shows a schematic cross-sectional structural diagram of a structure obtained in S711 along the dd' direction in FIG. 2, and Panel (E) in FIG. 10 shows a schematic cross-sectional structural diagram of a structure obtained in S711 along the direction of ee' in FIG. 2.

In S712, the substrate 1 is etched based on the side surface protective layer 17 to form multiple bit line trenches 18 arranged at intervals under the active pillars 10. Each of the bit line trenches 18 extends along the first direction.

As shown in FIG. 11, Panel (A) in FIG. 11 shows a schematic cross-sectional structural diagram of a structure obtained in S712 along the aa' direction in FIG. 2, Panel (B) in FIG. 11 shows a schematic cross-sectional structural diagram of a structure obtained in S712 along the bb' direction in FIG. 2, Panel (C) in FIG. 11 shows a schematic cross-sectional structural diagram of a structure obtained in S712 along the cc' direction in FIG. 2, Panel (D) in FIG. 11 shows a schematic cross-sectional structural diagram of a structure obtained in S712 along the dd' direction in FIG. 2, and Panel (E) in FIG. 11 shows a schematic cross-sectional structural diagram of a structure obtained in S712 along the ee' direction in FIG. 2.

In S715, a bit line 19 is formed in each of the bit line trenches 18.

As shown in FIG. 12, Panel (A) in FIG. 12 shows a schematic cross-sectional structural diagram of a structure obtained in S715 along the aa' direction in FIG. 2, Panel (B) in FIG. 12 shows a schematic cross-sectional structural diagram of a structure obtained in S715 along the bb' direction in FIG. 2, Panel (C) in FIG. 12 shows a schematic cross-sectional structural diagram of a structure obtained in S715 along the cc' direction in FIG. 2, Panel (D) in FIG. 12 shows a schematic cross-sectional structural diagram of a structure obtained in S715 in an embodiment of the present disclosure along the dd' direction in FIG. 2, and Panel (E) in FIG. 12 shows a schematic cross-sectional structural diagram of a structure obtained in S715 along the ee' direction in FIG. 2.

The material of the bit lines 19 is not specifically limited in the disclosure. For example, the material of the bit line 19 may include, but is not limited to, titanium (Ti) or tungsten (W).

In S715, the bit lines 19 may be formed by the following method. For example, a bit line material layer with whose top is higher than the bit line trenches 18 is formed. After forming the bit line material layer, the bit line material layer is etched back to form the bit lines 19 whose tops are lower than the bit line trenches 18. By doing so, short-circuiting between adjacent bit lines 19 can be avoided.

Referring further to FIG. 9, it is to be noted that, in one of the embodiments, the following operations may also be performed before forming the bit lines 19 within bit line trenches 18.

In S713, a third ion implantation is performed below the bit line trenches 18.

In S714, the obtained structure is annealed to form ion implantation regions 181 below the bit line trenches 18.

By forming the ion implantation regions 181 below the bit line trenches 18, the method for manufacturing a semiconductor structure provided by the above embodiment can reduce resistance of the bit lines that may be formed in subsequent manufacturing processes.

The disclosure does not particularly limit the type of implanted ions in the third ion implantation process in S713. For example, the implanted ions in the third ion implantation process may include, but are not limited to, phosphorus (P) ions or arsenic (As) ions.

The present disclosure does not particularly limit the manner of the annealing treatment in S714. For example, the obtained structure may be annealed by, but not limited to, a rapid thermal processing (RTP) process.

The disclosure does not particularly limit the height of the ion implantation region 181. For example, the height of the ion implantation region 181 may be 160 nm to 170 nm. For example, the height of the ion implantation region 181 may be 160 nm, 162 nm, 164 nm, 166 nm, 168 nm or 170 nm.

As an example, a second isolation dielectric layer 142 is filled in each of the third isolation trenches 13 by the following operations.

A second isolation dielectric material layer 1402 which fills up each of the third isolation trenches 13 and whose top is flush with the top of the patterned mask layer 16 is formed. After forming the second isolation dielectric material layer 1402, a partial height of the second isolation dielectric material layers 1402 is removed, so that the top of the remaining second isolation dielectric material layer 1402 is flush with the top of the third isolation trenches 13. The remaining second isolation dielectric material layers 1402 serves as the second isolation dielectric layers 142.

As shown in FIG. 13, Panel (A) in FIG. 13 shows a schematic cross-sectional structural diagram of a structure obtained after forming a second isolation dielectric material layer 1402 along the aa' direction in FIG. 2, Panel (B) in FIG. 13 shows a schematic cross-sectional structural diagram of a structure obtained after forming a second isolation dielectric material layer 1402 along the bb' direction in FIG. 2, Panel (C) in FIG. 13 shows a schematic cross-sectional structural diagram of a structure obtained after forming a second isolation dielectric material layer 1402 along the cc' direction in FIG. 2, Panel (D) in FIG. 13 shows a schematic cross-sectional structural diagram of a structure obtained after forming a second isolation dielectric material layer 1402 along the dd' direction in FIG. 2, and Panel (E) in FIG. 13 shows a schematic cross-sectional structural diagram of a structure obtained after forming a second isolation dielectric material layer 1402 along the ee' direction in FIG. 2.

Referring to FIG. 15, Panel (A) in FIG. 15 shows a schematic cross-sectional structural diagram of a structure obtained in S72 along the aa' direction in FIG. 2, Panel (B) in FIG. 15 shows a schematic cross-sectional structural diagram of a structure obtained in S72 along the bb' direction in FIG. 2, Panel (C) in FIG. 15 shows a schematic cross-sectional structural diagram of a structure obtained in S72 along the cc' direction in FIG. 2, Panel (D) in FIG. 15 shows a schematic cross-sectional structural diagram of a structure obtained in S72 along the dd' direction in FIG. 2, and Panel (E) in FIG. 15 shows a schematic cross-sectional structural diagram of a structure obtained in S72 along the ee' direction in FIG. 2.

Referring to FIGS. 7 and 10-12, as described above, the third isolation trenches 13 may extend into the isolation structure 15 of the peripheral region. Referring further to FIG. 13, after filling the second isolation dielectric layer 142 in each of the third isolation trenches 13, the method for manufacturing a semiconductor structure may further include an operation of forming a filling protective layer 151 in portion of each of the third isolation trenches 13 extending into the isolation structure 15.

In the method for manufacturing a semiconductor structure provided by the above-mentioned embodiment, the peripheral region is protected by forming the filling protective layer 151. As can be seen from the above operations, the process of forming the filling protective layer 151 does not require an additional mask, thus reducing the process cost.

Referring to FIGS. 16 to 21 in combination with FIG. 14, in one of the embodiments, the word line structures 21 may be formed by the following operations.

In S731, a sidewall 162 is formed on a side surface of each of the openings 161.

As shown in FIG. 16, Panel (A) in FIG. 16 shows a schematic cross-sectional structural diagram of a structure obtained in S731 along the aa' direction in FIG. 2, Panel (B) in FIG. 16 shows a schematic cross-sectional structural diagram of a structure obtained in S731 along the bb' direction in FIG. 2, Panel (C) in FIG. 16 shows a schematic cross-sectional structural diagram of a structure obtained in S731 along the cc' direction in FIG. 2, Panel (D) in FIG. 16 shows a schematic cross-sectional structural diagram of a structure obtained in S731 along the dd' direction in FIG. 2, and Panel (E) in FIG. 16 shows a schematic cross-sectional structural diagram of a structure obtained in S731 along the ee' direction in FIG. 2.

In S732, the first isolation dielectric layers 141 and the second isolation dielectric layers 142 are etched based on the sidewalls 162, so as to expose the second connecting ends 102 and the channel regions 103.

As shown in FIG. 17, Panel (A) in FIG. 17 shows a schematic cross-sectional structural diagram of a structure obtained in S732 along the aa' direction in FIG. 2, Panel (B) in FIG. 17 shows a schematic cross-sectional structural diagram of a structure obtained in S732 along the bb' direction in FIG. 2, Panel (C) in FIG. 17 shows a schematic cross-sectional structural diagram of a structure obtained in S732 along the cc' direction in FIG. 2, Panel (D) in FIG. 17 shows a schematic cross-sectional structural diagram of a structure obtained in S732 along the dd' direction in FIG. 2, and Panel (E) in FIG. 17 shows a schematic cross-sectional structural diagram of a structure obtained along the ee' direction in FIG. 2.

In S733, gate dielectric layers 211 are formed on the surfaces of the channel regions 103, and word line conductive layers 212 are formed on the surfaces of the gate dielectric layers 211.

The gate dielectric layer 211 covers the channel region 103. Each of the word line conductive layers 212 extends along the second direction to cover the channel regions 103 of the active pillars 10 in the same row.

Referring to FIG. 19, in one of the embodiments, the gate dielectric layers 211 are formed on the surfaces of the channel regions 103 and the word line conductive layers 212 are formed on the surfaces of the gate dielectric layers 211 by the following operations.

In S7331, gate dielectric material layers 201 are formed on surfaces of the second connecting ends 102 and surfaces of the channel regions 103.

In S7332, word line conductive material layers 202 are formed on surfaces of the gate dielectric material layers 201.

As shown in FIG. 18, Panel (A) in FIG. 18 shows a schematic cross-sectional structural diagram of a structure obtained in S7332 along the aa' direction in FIG. 2, Panel (B) in FIG. 18 shows a schematic cross-sectional structural diagram of a structure obtained in S7332 along the bb' direction in FIG. 2, Panel (C) in FIG. 18 shows a schematic cross-sectional structural diagram of a structure obtained in S7332 along the cc' direction in FIG. 2, Panel (D) in FIG. 18 shows a schematic cross-sectional structural diagram of a structure obtained in S7332 along the dd' direction in FIG. 2, and Panel (E) in FIG. 18 shows a schematic cross-sectional structural diagram of a structure obtained in S7332 along the ee' direction in FIG. 2.

In S7333, the gate dielectric material layers 201 located at the second connecting ends 102 and the word line conductive material layers 202 located at the second connecting ends 102 are etched to be removed, to obtain the gate dielectric layers 211 and the word line conductive layers 212.

In S7332, the word line conductive material layers 202 may be formed on the surfaces of the gate dielectric material layers 201 by the following method. For example, a conductive material layer filling up the third isolation trenches 13 and covering the top of the patterned mask layer 16 is formed. After forming the conductive material layer, a first etching is performed to remove a partial height of the conductive material layer, and a second etching is performed based on the patterned mask layer 16 and the sidewalls 162, so that the top of the remaining conductive material layer is flush with the tops of the third isolation trenches 13 and covers the channel regions of the active pillars 10 in the same row. The remaining conductive material layer serves as the word line conductive material layers 202.

As an example, the top of the conductive material layer may be 10 nm to 40 nm higher than the top of patterned mask layer 16.

As can be seen from the above operations, the process of the second etching 151 does not require an additional mask, thereby reducing the process cost.

The present disclosure does not particularly limit methods of the first etching and the second etching. As an example, the first etching may be a dry etching, and the second etching may be a wet etching.

Referring to further FIG. 19, in one of the embodiments, after forming the word line conductive material layers 202 on the surfaces of the gate dielectric material layers 201, before etching to remove the gate dielectric material layers 201 located at the second connecting ends 102 and the word line conductive material layers 202 located at the second connecting ends 102, the method for manufacturing a semiconductor structure further includes the following operations.

Isolation dielectric material layers 22 are formed between the word line conductive material layers 202. The patterned mask layer 16 and the sidewalls 162 are removed.

As shown in FIG. 20, Panel (A) in FIG. 20 shows a schematic cross-sectional structural diagram of a structure obtained after forming isolation dielectric material layers 22 between the word line conductive material layers 202 and removing the patterned mask layer 16 and the sidewalls 162 along the aa' direction in FIG. 2, Panel (B) in FIG. 20 shows a schematic cross-sectional structural diagram of a structure obtained after forming isolation dielectric material layers 22 between the word line conductive material layers 202 and removing the patterned mask layer 16 and the sidewalls 162 along the bb' direction in FIG. 2, Panel (C) in FIG. 20 shows a schematic cross-sectional structural diagram of a structure obtained after forming isolation dielectric material layers 22 between the word line conductive material layers 202 and removing the patterned mask layer 16 and the sidewalls 162 along the cc' direction in FIG. 2, Panel (D) in FIG. 20 shows a schematic cross-sectional structural diagram of a structure obtained after forming isolation dielectric material layers 22 between the word line conductive material layers 202 and removing the patterned mask layer 16 and the sidewalls 162 along the dd' direction in FIG. 2, and Panel (E) in FIG. 20 shows a schematic cross-sectional structural diagram of a structure obtained after forming isolation dielectric material layers 22 between the word line conductive material layers 202 and removing the patterned mask layer 16 and the sidewalls 162 along the ee' direction in FIG. 2.

Based on the above operations, while the gate dielectric material layers 201 at the second connecting ends 102 and the word line conductive material layers 202 at the second connecting ends 102 are removed by etching, parts of the isolation dielectric material layers 22 may be removed to form isolation dielectric layers 23.

The isolation dielectric layers 23 are located on the upper surfaces of the remaining first isolation dielectric layers 141 and the upper surfaces of the remaining second isolation dielectric layers 142, and fill up gaps between the word line structures 21.

Based on the above operations, after the gate dielectric layers 211, the word line conductive layers 212 and the isolation dielectric layers 23 are formed, an insulating dielectric layer 24 may also be formed.

The insulating dielectric layer 24 fills up gaps between the second connecting ends 102 of the adjacent active pillars 10.

As shown in FIG. 21, Panel (A) in FIG. 21 shows a schematic cross-sectional structural diagram of a structure obtained after forming an insulating dielectric layer 24 along the aa' direction in FIG. 2, Panel (B) in FIG. 21 shows a schematic cross-sectional structural diagram of a structure obtained after forming an insulating dielectric layer 24 along the bb' direction in FIG. 2, Panel (C) in FIG. 21 shows a schematic cross-sectional structural diagram of a structure obtained after forming an insulating dielectric layer 24 along the cc' direction in FIG. 2, Panel (D) in FIG. 21 shows a schematic cross-sectional structural diagram of a structure obtained after forming an insulating dielectric layer 24 along the dd' direction in FIG. 2, and Panel (E) in FIG. 21 shows a schematic cross-sectional structural diagram of a structure obtained after forming an insulating dielectric layer 24 along the ee' direction in FIG. 2.

It is to be understood that although the operations in the flowcharts of FIGS. 1, 5, 8, 9, 14, and 19 are shown sequentially as indicated by the arrows, these operations are not necessarily performed sequentially in the orders indicated by the arrows. Unless explicitly stated in the disclosure, there are no strict sequential restrictions on the execution of the operations, and the operations may be performed in other sequences. Further, at least part of the operations in FIGS. 1, 5, 8, 9, 14 and 19 may include multiple operations or multiple stages. The operations or stages are not necessarily executed at the same time, but may be executed at different times. These operations or stages are not necessarily executed sequentially, but may be executed in turn or alternately with other operations or at least part of the other operations or stages.

In another aspect, the embodiments of the disclosure provide a semiconductor structure.

Referring further to FIG. 21, in one of the embodiments, the semiconductor structure may include a substrate 1, a first isolation dielectric layer 141, an isolation structure 15 and a second isolation dielectric layer 142.

The substrate 1 includes a cell region and a peripheral region located at a periphery of the cell region.

First isolation trenches 11 and third isolation trenches 13 are provided in the cell region. The first isolation trenches 13 and the third isolation trenches 11 may jointly isolate the multiple active pillars 10. The first isolation trench 11 extends in a first direction and the third isolation trench 13 extends in a second direction. The first direction intersects the second direction. Each of the active pillars 10 includes a first connecting end, a second connecting end 102 and a channel region 103 located between the first connecting end and the second connecting end 102.

The second isolation trench 12 is provided in the peripheral region. The second isolation trench 12 and the first isolation trenches 11 are formed based on the same photolithography etching process.

The First isolation dielectric layer 141 is located in each of the first isolation trenches 11. The isolation structure 15 is located in the second isolation trench 12. The second isolation dielectric layer 142 is located in each of the third isolation trenches 13, and the second isolation dielectric layers 142 and the first isolation dielectric layers 141 together cover the first connecting ends of the active pillars 10.

In the semiconductor structure provided by the above embodiment, the second isolation trench 12 and the first isolation trenches 11 are formed based on the same photolithography etching process, so necessary process operations in the manufacturing process of the semiconductor structure in the above embodiments are less than those in the traditional process, so that production efficiency is higher and required production cost is lower.

In one of the embodiments, the first connecting end is a drain region. The second connecting end is a source region. Doped ions are implanted into the channel region 103.

Referring further to FIG. 21, in one of the embodiments, the semiconductor structure may also include multiple bit lines 19 arranged at intervals and multiple word line structures arranged at intervals 21.

The bit lines 19 are located below the active pillars 10 and each of the bit lines 19 extends in the first direction, to connect the first connecting ends of the active pillars 10 in the same column in series. Each of the word line structures 21 extends in the second direction to cover the channel regions 103 of the active pillars 10 in the same row.

Referring to FIG. 21, in one of the embodiments, each of the word line structures 21 includes gate dielectric layers 211 and a word line conductive layer 212.

The gate dielectric layers 211 are located on surfaces of the channel regions 103 and cover the channel regions 103.

The word line conductive layer 212 is located on surfaces of the gate dielectric layers 211 and extends along the second direction to cover the channel regions 103 of the active pillars 10 in the same row.

Referring to FIG. 21, in one of the embodiment, the semiconductor structure further includes ion implantation regions 181.

The ion implantation regions 181 are located within the substrate 1 and below the bit lines 19.

Referring further to FIG. 21, in one of the embodiments, the third isolation trenches 13 further extend into the isolation structure 15 of the peripheral region.

On this basis, the semiconductor structure may further include a filling protective layer 151. The filling protective layer 151 is located on a part of each of the third isolation trenches 13 that extend into the isolation structure 15.

Referring further to FIG. 21, in one of the embodiments, the semiconductor structure further includes isolation dielectric layers 23 and an insulating dielectric layer 24.

The isolation dielectric layers 23 are located on upper surfaces of the first isolation dielectric layers 141 and upper surfaces of the second isolation dielectric layers 142 and fill up gaps between the word line structures 21.

The insulating dielectric layer 24 fills up gaps between the second connecting ends 102 of the adjacent active pillars 10.

It should be noted that the method for manufacturing a semiconductor structures in the embodiments of the present disclosure can be used to manufacture the corresponding semiconductor structure. Therefore, the technical features between the method embodiments and the structural embodiments can be replaced and supplemented with each other without conflict, so that technicians in the field can learn the technical contents of the present disclosure.

The above-mentioned technical features of the embodiments can be arbitrarily combined. For the sake of concise description, all possible combinations of the above-mentioned technical features of the embodiments have not been described. However, as long as there is no contradiction in the combinations of these technical features, they should be considered to be within the scope described in this specification.

The above-mentioned embodiments only represent several embodiments of the present disclosure, and the description thereof is relatively specific and detailed, but is not to be construed as limiting the scope of the patent application. It should be noted that for those skilled in the art, without departing from the concept of the present application, a number of modifications and improvements may be made, which all fall within the scope of protection of the present application. Therefore, the scope of protection of the patent application shall be subject to the attached claims.

What is claimed is:

1. A method for manufacturing a semiconductor structure, comprising:
    providing a substrate, wherein the substrate comprises a cell region and a peripheral region located at a periphery of the cell region;
    etching the substrate to form first isolation trenches in the cell region and a second isolation trench in the peripheral region, wherein the first isolation trenches extend along a first direction;
    filling a first isolation dielectric layer in each of the first isolation trenches and forming an isolation structure in the second isolation trench;
    forming a patterned mask layer on a surface of the cell region and a surface of the peripheral region, wherein openings are provided in the patterned mask layer and the openings define shapes and positions of third isolation trenches; and
    etching the substrate and the first isolation dielectric layer based on the patterned mask layer to form the third isolation trenches, wherein the third isolation trenches extend along a second direction, the third isolation trenches and the first isolation trenches jointly isolate a plurality of active pillars, and each of the active pillars comprises a first connecting end, a second connecting end and a channel region located between the first connecting end and the second connecting end.

2. The method for manufacturing a semiconductor structure according to claim 1, wherein after filling the first isolation dielectric layer and forming the isolation structure in the second isolation trench, and after forming the third isolation trenches, the method for manufacturing a semiconductor structure further comprises:
    performing a first ion implantation on each of the active pillars to form a drain region at the first connecting end, a source region at the second connecting end and the channel region between the first connecting end and the second connecting end; and
    performing a second ion implantation in the channel region.

3. The method for manufacturing a semiconductor structure according to claim 1, wherein after etching the substrate and the first isolation dielectric layer based on the patterned mask layer to form the third isolation trenches, the method for manufacturing a semiconductor structure further comprises:
    forming a plurality of bit lines arranged at intervals in the cell region, wherein the bit lines are located below the active pillars, and each of the bit lines extends along the first direction to connect the first connecting ends of the active pillars in a same column in series;
    filling a second isolation dielectric layer in each of the third isolation trenches; and
    forming a plurality of word line structures arranged at intervals, wherein each of the word line structures extends along the second direction to cover the channel regions of the active pillars in a same row.

4. The method for manufacturing a semiconductor structure according to claim 3, wherein forming the plurality of the bit lines arranged at intervals in the cell region comprises:
    forming a side surface protective layer on a side surface of each of the active pillars and a side surface of each of the openings;
    etching the substrate based on the side surface protective layers to form a plurality of bit line trenches arranged at intervals under the active pillars and extending along the first direction; and
    forming each of the bit lines in each of the bit line trenches.

5. The method for manufacturing a semiconductor structure according to claim 4, wherein before forming each of the bit lines in each of the bit line trenches, the method for manufacturing a semiconductor structure further comprises:
    performing a third ion implantation under the bit line trenches; and
    annealing a obtained structure to form ion implantation regions under the bit line trenches.

6. The method for manufacturing a semiconductor structure according to claim 5, wherein a height of each of the ion implantation regions is 160 nm to 170 nm.

7. The method for manufacturing a semiconductor structure according to claim 3, wherein the third isolation trenches further extends into the isolation structure of the peripheral region; and
    after filling the second isolation dielectric layer in each of the third isolation trenches, the method for manufacturing a semiconductor structure further comprises:
        forming a filling protective layer in a part of each of the third isolation trenches located in the isolation structure.

8. The method for manufacturing a semiconductor structure according to claim 3, wherein forming the plurality of the word line structures arranged at intervals comprises:
    forming a sidewall on a side surface of each of the openings;
    etching the first isolation dielectric layers and the second isolation dielectric layers based on the sidewalls, to expose the second connecting ends and the channel regions; and
    forming gate dielectric layers on surfaces of the channel regions and forming word line conductive layers on surfaces of the gate dielectric layers, wherein each of the gate dielectric layers covers each of the channel regions, each of the word line conductive layers extends along the second direction to cover the channel regions of the active pillars in the same row.

9. The method for manufacturing a semiconductor structure according to claim 8, wherein forming the gate dielectric layers on the surfaces of the channel regions and forming word line conductive layers on the surfaces of the gate dielectric layers comprises:
   forming gate dielectric material layers on surfaces of the second connecting ends and surfaces of the channel regions;
   forming word line conductive material layers on surfaces of the gate dielectric material layers; and
   etching to remove the gate dielectric material layers located at the second connecting ends and the word line conductive material layers located at the second connecting ends, to obtain the gate dielectric layers and the word line conductive layers.

10. The method for manufacturing a semiconductor structure according to claim 9, wherein after forming the word line conductive material layers on the surfaces of the gate dielectric material layers, before etching to remove the gate dielectric material layers located at the second connecting ends and the word line conductive material layers located at the second connecting ends, the method for manufacturing a semiconductor structure further comprises:
   forming isolation dielectric material layers between the word line conductive material layers, and removing the patterned mask layer and the sidewalls;
   removing parts of the isolation dielectric material layers to form isolation dielectric layers, and etching to remove the gate dielectric material layers located at the second connecting ends and the word line conductive material layers located at the second connecting ends at the same, wherein the isolation dielectric layers are located on upper surfaces of the remaining first isolation dielectric layers and upper surfaces of the remaining second isolation dielectric layers, and fill up gaps between the adjacent word line structures; and
   forming an insulating dielectric layer, after forming the gate dielectric layers, the word line conductive layers and the isolation dielectric layers, wherein the insulating dielectric layer fills up gaps between the second connecting ends of the adjacent active pillars.

\* \* \* \* \*